United States Patent
Sontowski

(10) Patent No.: US 7,555,071 B2
(45) Date of Patent: Jun. 30, 2009

(54) METHOD AND APPARATUS FOR NON-LINEAR SCALING OF LOG LIKELIHOOD RATIO (LLR) VALUES IN A DECODER

(75) Inventor: Uwe Sontowski, Riverview (AU)

(73) Assignee: Agere Systems Inc., Allentown, PA (US)

( * ) Notice: Subject to any disclaimer, the term of this patent is extended or adjusted under 35 U.S.C. 154(b) by 511 days.

(21) Appl. No.: 11/239,274

(22) Filed: Sep. 29, 2005

(65) Prior Publication Data

US 2007/0071140 A1 Mar. 29, 2007

(51) Int. Cl.
*H03D 1/00* (2006.01)
*H04L 27/06* (2006.01)

(52) U.S. Cl. .................. 375/341; 375/262; 714/755; 714/794

(58) Field of Classification Search ............. 375/267, 375/341; 714/752, 746, 786, 780, 791, 794–795
See application file for complete search history.

(56) References Cited

U.S. PATENT DOCUMENTS

| | | | | |
|---|---|---|---|---|
| 5,862,190 | A * | 1/1999 | Schaffner | 375/341 |
| 6,757,337 | B2 * | 6/2004 | Zhuang et al. | 375/267 |
| 6,993,703 | B2 * | 1/2006 | Miyauchi | 714/794 |
| 7,027,497 | B2 * | 4/2006 | Ohmori et al. | 375/229 |
| 7,055,089 | B2 * | 5/2006 | Miyauchi et al. | 714/794 |
| 7,185,267 | B2 * | 2/2007 | Koppelaar | 714/794 |
| 2003/0088820 | A1 | 5/2003 | Koppelaar | 714/755 |
| 2004/0047438 | A1 * | 3/2004 | Zhuang et al. | 375/340 |
| 2004/0151259 | A1 | 8/2004 | Berens et al. | 375/340 |
| 2004/0179583 | A1 | 9/2004 | Jeong | 374/147 |
| 2004/0258139 | A1 | 12/2004 | Namgoong et al. | 375/147 |
| 2005/0120286 | A1 * | 6/2005 | Akamatsu | 714/792 |
| 2005/0129147 | A1 * | 6/2005 | Cannon et al. | 375/324 |
| 2007/0127605 | A1 * | 6/2007 | Sindhushayana | 375/341 |

OTHER PUBLICATIONS

Wu et al., "The Influence of Quantization and Fixed Point Arithmetic Upon the Ber Performance of Turbo Codes," IEEE, pp. 1683-1687 (1999).

* cited by examiner

*Primary Examiner*—Jean B Corrielus
(74) *Attorney, Agent, or Firm*—Ryan, Mason & Lewis, LLP

(57) ABSTRACT

Methods and apparatus are provided for non-linear scaling of log likelihood ratio (LLR) values in a decoder. A decoder according to the present invention processes a received signal by generating a plurality of log-likelihood ratios having a first resolution; applying a non-linear function to the plurality of log-likelihood ratios to generate a plurality of log-likelihood ratios having a lower resolution; and applying the plurality of log-likelihood ratios having a lower resolution to a decoder. The non-linear function can distribute the log-likelihood ratios, for example, such that the frequency of each LLR value is more uniform than a linear scaling.

19 Claims, 3 Drawing Sheets

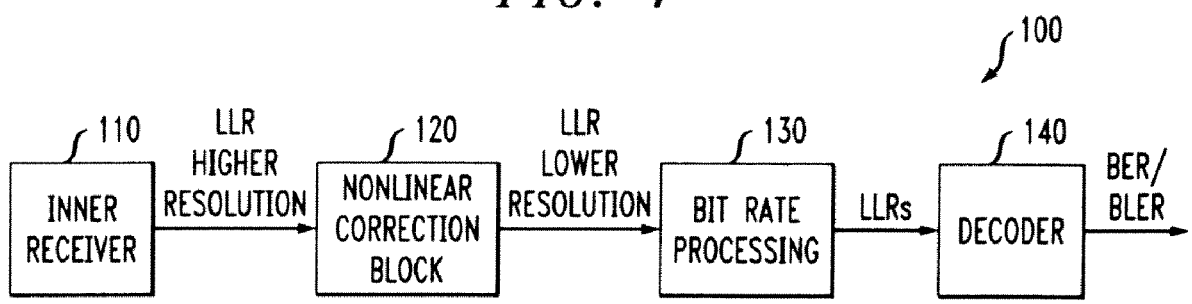
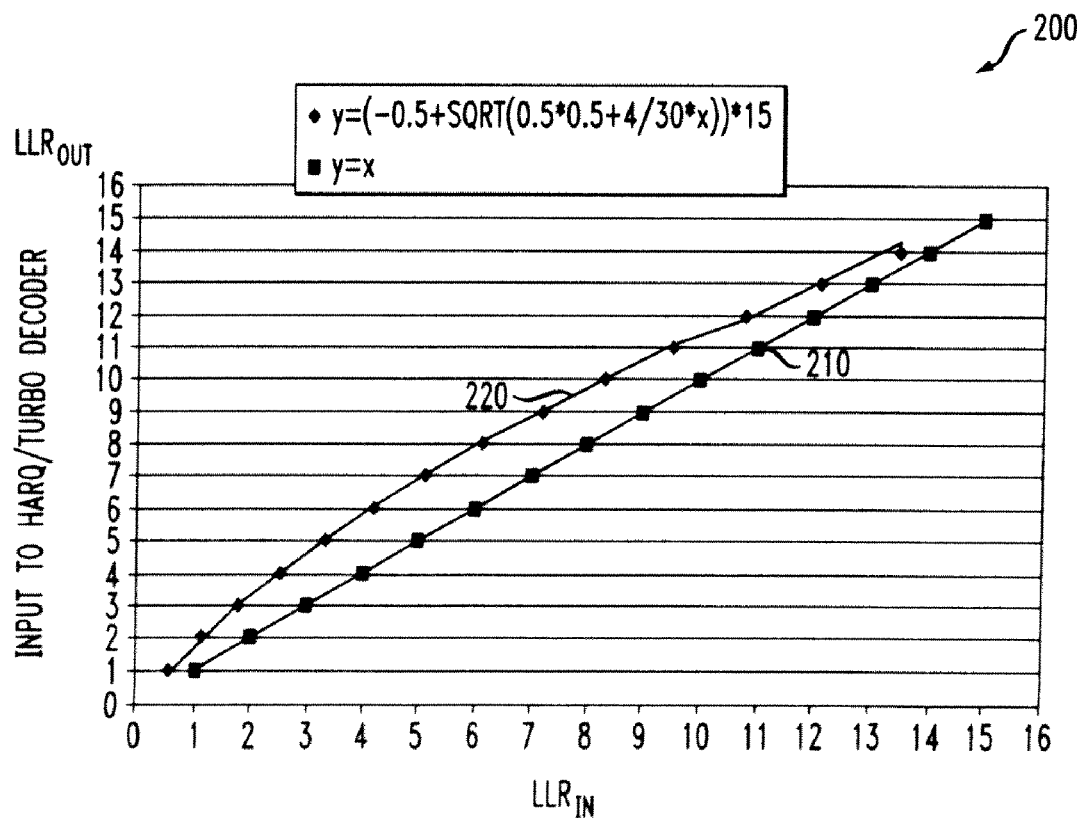

METHOD AND APPARATUS FOR NON-LINEAR SCALING OF LOG LIKELIHOOD RATIO (LLR) VALUES IN A DECODER

FIELD OF THE INVENTION

The present invention relates generally to decoding techniques for turbo codes, and more particularly, to methods and apparatus for scaling values in a turbo decoder.

BACKGROUND OF THE INVENTION

Error correction techniques are used in a number of communication and storage systems. Error correction codes, such as Reed-Solomon codes, add one or more redundant bits to a digital stream prior to transmission or storage, so that a decoder can detect and possibly correct errors caused by noise or other interference. One class of error correction codes are referred to as "turbo" codes. Generally, turbo codes employ a combination of two or more systematic convolutional or block codes. Typically, an iterative decoding technique is employed where the output of each decoding step, for example, from an inner receiver, serves as an input to the subsequent decoding step performed by an outer receiver. In many implementations, the inner receiver generates log-likelihood ratios (LLRs) that are processed by the outer receiver.

In a CDMA receiver, for example, an inner receiver typically demodulates the received signal into symbols and the outer receiver forms, processes and decodes each frame, comprised of a collection of symbols. The output signal of the inner receiver is often quantized to a smaller number of bits and then processed by a soft input/soft output decoder. U.S. patent application Ser. No. 10/387,876, entitled "Method and Apparatus for Decoder Input Scaling Based on Interference Estimation in CDMA," for example, discloses a technique for scaling the decoder input for a CDMA receiver to a smaller number of bits to reduce the memory requirement. In order to maintain the decoder performance for a smaller number of input bits, the disclosed method estimates the interference of the inner receiver output and scales the decoder input such that its variance is maintained.

A number of techniques have been proposed or suggested for adjusting various parameters of a turbo decoder to improve the throughput or Bit Error Rate (BER) performance. Y. Wu and B. Woerner, "The Influence of Quantization and Fixed Point Arithmetic Upon the BER Performance of Turbo Codes," Proc. IEEE Veh. Tech. Conf., Houston, Tex. (May, 1999), for example, evaluates the influence of quantization and fixed point arithmetic upon the BER performance of turbo decoders. Wu and Woerner demonstrate that with proper scaling of the received signal prior to quantization, there is no degradation of the BER performance with eight bit quantization (or even four bit quantization).

Generally, the inner receiver in such conventional turbo decoding techniques generates floating point LLRs (soft bits) that are scaled in a linear manner, and then mapped to a fixed point. Most known techniques for scaling decoder inputs have used a gain control method. For example, the mean square or mean absolute values of the inner receiver output have been employed. The technique disclosed in the above-referenced U.S. patent application Ser. No. 10/387,876 employ a noise variance of the channel in order to scale the decoder input. A need exists for methods and apparatus for scaling or shaping the LLR distribution in a manner that improves the BER performance. A further need exists for methods and apparatus for scaling or shaping the LLR distribution in a non-linear manner.

SUMMARY OF THE INVENTION

Generally, methods and apparatus are provided for non-linear scaling of log likelihood ratio (LLR) values in a decoder, such as a universal mobile telecom system (UMTS) receiver. According to one aspect of the invention, a decoder processes a received signal by generating a plurality of log-likelihood ratios having a first resolution; applying a non-linear function to the plurality of log-likelihood ratios to generate a plurality of log-likelihood ratios having a lower resolution; and applying the plurality of log-likelihood ratios having a lower resolution to a decoder. The non-linear function can distribute the log-likelihood ratios, for example, such that the frequency of each LLR value is more uniform than a linear scaling.

The plurality of log-likelihood ratios having a first resolution may be generated by an inner receiver, such as a Rake receiver, a minimum mean squared error (MMSE) receiver, a decorrelating receiver, an equalizer or an interference canceller. The plurality of log-likelihood ratios having a lower resolution can be processed by an outer decoder, such as a Turbo decoder or a Viterbi decoder.

A more complete understanding of the present invention, as well as further features and advantages of the present invention, will be obtained by reference to the following detailed description and drawings.

BRIEF DESCRIPTION OF THE DRAWINGS

FIG. 1 is a schematic block diagram of an exemplary receiver incorporating features of the present invention;

FIG. 2 illustrates an example of an LLR mapping performed by the correction block of FIG. 1 in accordance with the present invention;

DETAILED DESCRIPTION

Figure 3:
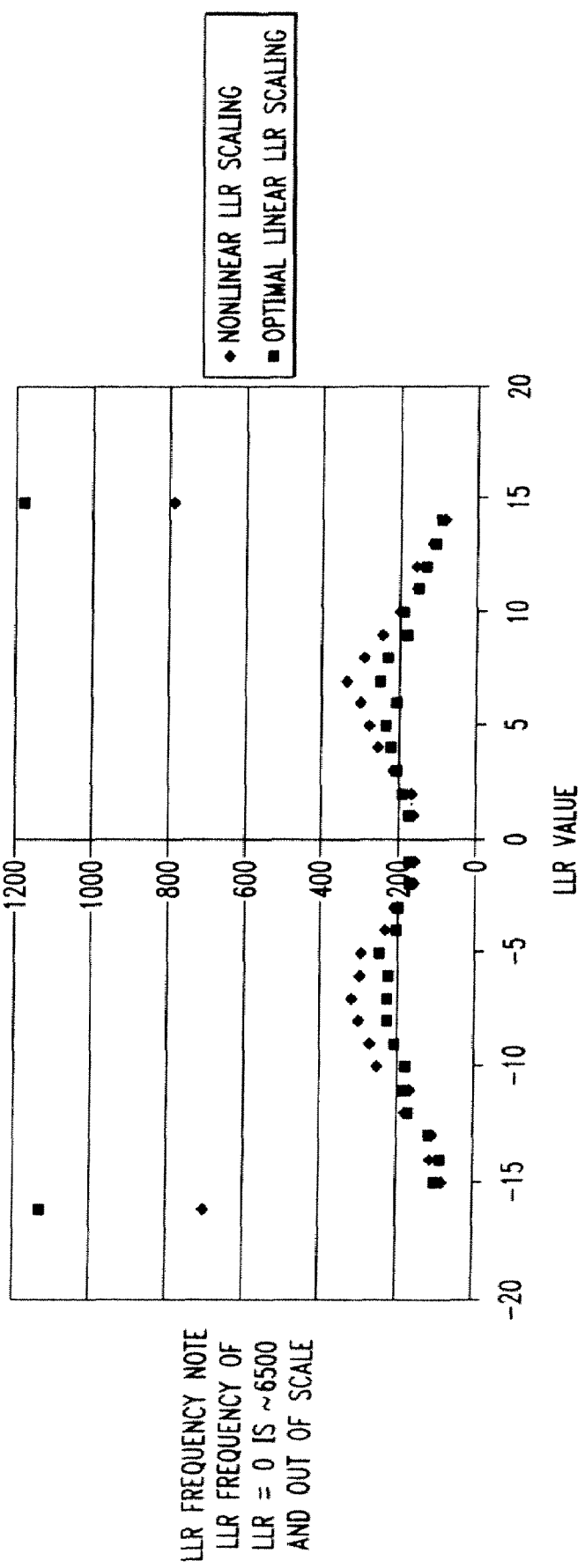
FIG. 3 illustrates the frequency of each LLR value for both a conventional linear mapping and a non-linear mapping in accordance with the present invention.

The present invention provides methods and apparatus for scaling or shaping the LLR distribution in a manner that improves the BER performance. According to one aspect of the present invention, the LLR distribution is shaped in a non-linear manner.

FIG. 1 is a schematic block diagram of an exemplary receiver 100 incorporating features of the present invention. While the present invention is illustrated in the context of a universal mobile telecom system (UMTS) receiver, in accordance with a 3rd Generation Partnership Project (3GPP) standard, the present invention may be implemented in any decoder employing soft decision decoding, as would be apparent to a person of ordinary skill in the art. For a detailed discussion of the 3GPP specification, see, for example, 3GPP TS 25.212, "Multiplexing and Channel Coding (FDD)," and 3GPP TS 25.101, "User Equipment (UE) Radio Transmission And Reception (FDD)," incorporated by reference herein As shown in FIG. 1, the exemplary receiver 100 comprises an inner receiver 110, a correction block 120, a bit rate processing block 130 and a decoder 140. The inner receiver 110 may be implemented, for example, as a Rake receiver, a minimum mean squared error (MMSE) receiver, a decorrelating receiver, an equalizer or an interference canceller, or some combination of the foregoing, as would be apparent to a person of ordinary skill. Generally, the inner receiver 110 generates log-likelihood ratios (LLRs), in a known manner, that are processed by the decoder 140. The inner receiver 110 operates at the chip rate, while the bit rate processing block 130 and decoder 140 operate at the bit rate.

As previously indicated, it is known to quantize the output signal of the inner receiver 110 from a set of LLRs with a first resolution to a set of LLRs with a lower resolution (i.e., having a smaller number of bits). The LLRs with a lower resolution are then processed by bit rate processing block 130 and the decoder 140. Generally, the inner receiver 110 in conventional turbo decoding techniques generates LLRs that are scaled in a linear manner, for example, using a gain control method.

According to one aspect of the present invention, the correction block 120 maps the LLR values into a lower resolution using a non-linear function. The present invention recognizes that the LLRs generated by the inner receiver 110 may not have the right shape for optimal processing in the bit rate processing block 130. In this manner, the correction block 120 can apply a non-linear function to the LLRs to shape them such that the bit and block error rate performance metrics (BER and BLER) are improved.

In one exemplary implementation, the non-linear correction block 120 applies the following non-linear function to the LLRs generated by the inner receiver 110:

LLRout=(−0.5+sqrt(0.5\*\*2+4/30\*LLRin) for LLRin>=0,
LLRout=−(−0.5+sqrt(0.5\*\*2+4/30\*−LLRin) for LLRin<0.

It is noted that the LLRout values produced by the correction block 120 are typically fixed point values up to five bits and the LLRin values are typically higher resolution fixed point values. The step size for each step can be optimized for the intended scenario, as would be apparent to a person of ordinary skill. A heuristic process is employed to identify a suitable non-linear function. Generally, the LLRs are skewed in such a way that distributes the LLRs a bit more evenly, and thus provides additional information to the turbo decoder 140 about the different LLRs.

The bit rate processing block 130 implements a number of bit rate processing steps in accordance with the exemplary 3GPP standard, such as rate matching, HARQ processing and buffering. The decoder 140 may be implemented, for example, as a Turbo or Viterbi decoder.

FIG. 2 illustrates the LLR mapping performed by the correction block 120 in accordance with the present invention. As shown in FIG. 2, the correction block 120 applies a non-linear function 220 to the LLRs generated by the inner receiver 110 ($LLR_{IN}$). In addition, a conventional linear mapping 210 is also shown.

It is noted that the correction block 120 could be implemented in hardware or software. For a hardware implementation, the non-linear function 220 could be implemented, for example, in the form of a lookup table. If the higher resolution LLR ($LLR_{IN}$) has a 7 bit resolution including one bit sign, and assuming the lookup table is symmetrical around 0, the lookup table can be implemented with 6 bits input and 4 bits output and the sign bit would be maintained from input to output.

FIG. 3 is a plot 300 illustrating the frequency of each LLR value for both a conventional linear mapping and a non-linear mapping in accordance with the present invention. As shown in FIG. 3, each data point for a conventional linear mapping is shown using a square bullet and each data point for a non-linear mapping is shown using a diamond bullet. Thus, FIG. 3 illustrates the LLR distribution before and after reshaping. It is noted that the frequency of the LLR value at zero (0) is approximately 6500 in the exemplary embodiment, although not shown in the scale presented in FIG. 3.

Among other benefits, the present invention optimizes the BER/BLER over the whole receiver processing chain. In addition, the throughput with the non-linear reshaping of the present invention has been observed to perform better than without an LLR reshaping.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

Figure 4:
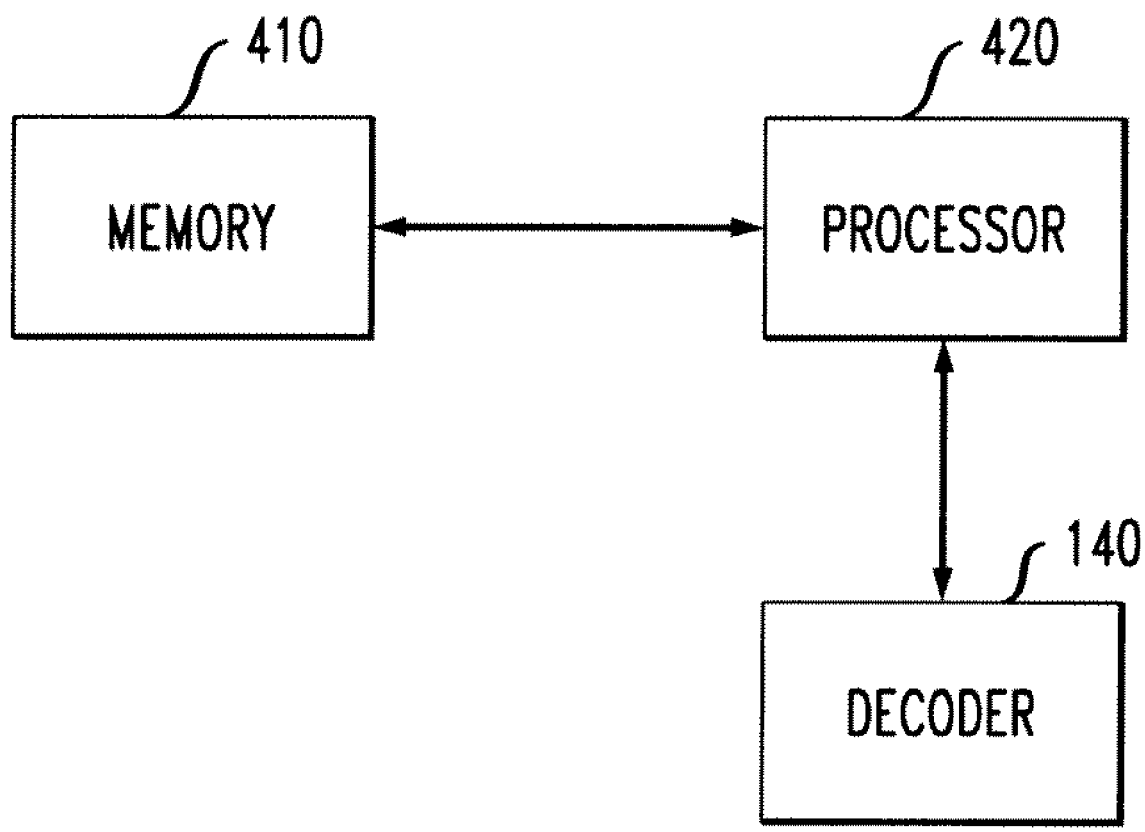
FIG. 4 is a schematic block diagram of a memory coupled to a processor.

FIG. 4 is a schematic block diagram of a memory coupled to a processor. The computer systems and servers described herein each contain a memory 410 that will configure associated processors 420 to implement the methods, steps, and functions disclosed herein. The memories 410 could be distributed or local and the processors 420 could be distributed or singular. The memories 410 could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for processing a received signal, comprising:
   generating a plurality of log-likelihood ratios, LLRin, having a first resolution by an inner receiver;
   applying a non-linear function to said plurality of log-likelihood ratios, LLRin, to generate a plurality of log-likelihood ratios, LLRout, having a lower resolution, wherein said non-linear function is based on an expression that includes a square root of a summation, wherein said summation is based on a first constant and a product, and wherein said product is based on a second constant and LLRin; and
   applying said plurality of log-likelihood ratios, LLRout, having a lower resolution to a decoder that decodes said received signal.

2. The method of claim 1, wherein said inner receiver is one or more of a Rake receiver, a minimum mean squared error (MMSE) receiver, a decorrelating receiver, an equalizer or an interference canceller.

3. The method of claim 1, wherein said decoder is a Turbo decoder or a Viterbi decoder.

4. The method of claim 1, wherein said non-linear function distributes said log-likelihood ratios, LLRin.

5. The method of claim 1, wherein said received signal is encoded using turbo encoding.

6. The method of claim 1, wherein said method is performed by a universal mobile telecom system (UMTS) receiver.

7. The method of claim 6, wherein said universal mobile telecom system receiver complies with the 3rd Generation Partnership Project (3GPP) standard.

8. A decoder for processing a received signal, comprising:
an inner receiver for generating a plurality of log-likelihood ratios, LLRin, having a first resolution;
a non-linear correction block for applying a non-linear function to said plurality of log-likelihood ratios, LLRin, to generate a plurality of log-likelihood ratios, LLRout, having a lower resolution, wherein said non-linear function is based on an expression that includes a square root of a summation, wherein said summation is based on a first constant and a product, and wherein said product is based on a second constant and LLRin; and
an outer decoder for processing said plurality of log-likelihood ratios, LLRout, having a lower resolution wherein said outer decoder decodes said received signal.

9. The decoder of claim 8, wherein said inner receiver is one or more of a Rake receiver, a minimum mean squared error (MMSE) receiver, a decorrelating receiver, an equalizer or an interference canceller.

10. The decoder of claim 8, wherein said outer decoder is a Turbo decoder or a Viterbi decoder.

11. The decoder of claim 8, wherein said non-linear function distributes said log-likelihood ratios, LLRin.

12. The decoder of claim 8, wherein said received signal is encoded using turbo encoding.

13. The decoder of claim 8, wherein said decoder comprises a universal mobile telecom system (UMTS) receiver.

14. The decoder of claim 13, wherein said universal mobile telecom system receiver complies with the 3rd Generation Partnership Project (3GPP) standard.

15. A system for processing a received signal, comprising:
a memory; and
at least one processor, coupled to the memory, operative to:
generate a plurality of log-likelihood ratios, LLRin, having a first resolution;
apply a non-linear function to said plurality of log-likelihood ratios, LLRin, to generate a plurality of log-likelihood ratios, LLRout, having a lower resolution, wherein said non-linear function is based on an expression that includes a square root of a summation, wherein said summation is based on a first constant and a product, and wherein said product is based on a second constant and LLRin; and
apply said plurality of log-likelihood ratios, LLRout, having a lower resolution to a decoder that decodes said received signal.

16. The system of claim 15, wherein said decoder is a Turbo decoder or a Viterbi decoder.

17. The system of claim 15, wherein said non-linear function distributes said log-likelihood ratios, LLRin.

18. The system of claim 15, wherein said received signal is encoded using turbo encoding.

19. The system of claim 15, wherein said system is a universal mobile telecom system (UMTS) receiver.

* * * * *